United States Patent
Holden

(10) Patent No.: US 10,802,168 B2
(45) Date of Patent: Oct. 13, 2020

(54) PREDICTING HYDRAULIC FRACTURE TREATMENT EFFECTIVENESS AND PRODUCTIVITY IN OIL AND GAS RESERVOIRS

(71) Applicant: CGG SERVICES SAS, Massy (FR)

(72) Inventor: Ted Holden, Katy, TX (US)

(73) Assignee: CGG SERVICES SAS, Massy (FR)

( * ) Notice: Subject to any disclaimer, the term of this patent is extended or adjusted under 35 U.S.C. 154(b) by 634 days.

(21) Appl. No.: 15/520,118

(22) PCT Filed: Oct. 26, 2015

(86) PCT No.: PCT/IB2015/002249
§ 371 (c)(1),
(2) Date: Apr. 19, 2017

(87) PCT Pub. No.: WO2016/067108
PCT Pub. Date: May 6, 2016

(65) Prior Publication Data
US 2018/0299571 A1   Oct. 18, 2018

Related U.S. Application Data

(60) Provisional application No. 62/068,782, filed on Oct. 27, 2014.

(51) Int. Cl.
*G06F 30/3308*   (2020.01)
*G01V 1/28*   (2006.01)
(Continued)

(52) U.S. Cl.
CPC ......... *G01V 1/282* (2013.01); *E21B 41/0092* (2013.01); *E21B 43/00* (2013.01);
(Continued)

(58) Field of Classification Search
USPC ............................................. 703/2, 10, 4, 6
See application file for complete search history.

(56) References Cited

U.S. PATENT DOCUMENTS 6,376,838 B1   4/2002   Odom
7,181,380 B2 *   2/2007   Dusterhoft ............ E21B 49/006
                                                        166/250.07
(Continued)

FOREIGN PATENT DOCUMENTS

CN   103792581 A   5/2014
EP   0 151 073 A2   8/1985
(Continued)

OTHER PUBLICATIONS

International Search Report, and Written Opinion, dated Mar. 3, 2016, from corresponding PCT Application No. PCT/IB2015/002249.
(Continued)

*Primary Examiner* — Thai Q Phan
(74) *Attorney, Agent, or Firm* — Patent Portfolio Builders PLLC

(57) ABSTRACT

Predicting hydraulic fracture treatment uses well log data and core data from one well in a given subsurface region to create a petrophysical properties model for the subsurface region. The petrophysical properties model yields fluid volumes and mineral volumes in any given well passing through the subsurface region using only well log data as inputs. The fluid and mineral volumes are used with dipole sonic data from a second well to create an elastic rock properties model for the given subsurface that yields elastic properties in any well passing through the subsurface region using only well log data and mineral and fluid volumes. For wells in the subsurface having only well log data, the petrophysical properties model and the elastic rock properties model are used with the well log data to predict an
(Continued)

amount of recoverable hydrocarbons within wells that will respond to hydraulic fracture treatments.

19 Claims, 3 Drawing Sheets

(51) Int. Cl.
<table>
<tr><td>E21B 43/26</td><td>(2006.01)</td></tr>
<tr><td>E21B 49/00</td><td>(2006.01)</td></tr>
<tr><td>G01V 1/30</td><td>(2006.01)</td></tr>
<tr><td>G01V 11/00</td><td>(2006.01)</td></tr>
<tr><td>G01V 1/50</td><td>(2006.01)</td></tr>
<tr><td>E21B 43/00</td><td>(2006.01)</td></tr>
<tr><td>E21B 41/00</td><td>(2006.01)</td></tr>
<tr><td>E21B 49/02</td><td>(2006.01)</td></tr>
<tr><td>E21B 49/08</td><td>(2006.01)</td></tr>
</table>

(52) U.S. Cl.
CPC .............. *E21B 43/26* (2013.01); *E21B 49/00* (2013.01); *E21B 49/02* (2013.01); *E21B 49/08* (2013.01); *G01V 1/306* (2013.01); *G01V 1/50* (2013.01); *G01V 11/00* (2013.01); *G06F 30/3308* (2020.01); *G01V 2210/624* (2013.01); *G01V 2210/6242* (2013.01); *G01V 2210/646* (2013.01)

(56) References Cited

U.S. PATENT DOCUMENTS

<table>
<tr><td>7,603,265</td><td>B2*</td><td>10/2009</td><td>Mainguy</td><td>G01V 1/282<br>703/10</td></tr>
<tr><td>7,953,587</td><td>B2*</td><td>5/2011</td><td>Bratton</td><td>E21B 43/00<br>703/10</td></tr>
<tr><td>8,117,014</td><td>B2*</td><td>2/2012</td><td>Prioul</td><td>G01V 1/48<br>367/31</td></tr>
<tr><td>8,498,853</td><td>B2*</td><td>7/2013</td><td>Crawford</td><td>G01V 99/00<br>703/10</td></tr>
<tr><td>10,132,147</td><td>B2*</td><td>11/2018</td><td>Safariforoshani</td><td>E21B 43/26</td></tr>
<tr><td>10,302,785</td><td>B2*</td><td>5/2019</td><td>Dirksen</td><td>E21B 47/024</td></tr>
<tr><td>10,352,145</td><td>B2*</td><td>7/2019</td><td>Maxwell</td><td></td></tr>
<tr><td>2007/0183260</td><td>A1</td><td>8/2007</td><td>Lee et al.</td><td></td></tr>
<tr><td>2007/0294034</td><td>A1*</td><td>12/2007</td><td>Bratton</td><td>E21B 41/00<br>702/6</td></tr>
<tr><td>2008/0004847</td><td>A1*</td><td>1/2008</td><td>Bradford</td><td>G01V 1/30<br>703/10</td></tr>
<tr><td>2011/0015907</td><td>A1*</td><td>1/2011</td><td>Crawford</td><td>G01V 99/00<br>703/2</td></tr>
<tr><td>2011/0208431</td><td>A1</td><td>8/2011</td><td>Skelt</td><td></td></tr>
<tr><td>2016/0169854</td><td>A1*</td><td>6/2016</td><td>Greathouse</td><td>G16C 20/30<br>702/27</td></tr>
</table>

FOREIGN PATENT DOCUMENTS

<table>
<tr><td>WO</td><td>92/06391 A1</td><td>4/1992</td></tr>
<tr><td>WO</td><td>03/040743 A1</td><td>5/2003</td></tr>
</table>

OTHER PUBLICATIONS

Jude O. Amaefule et al., "Enhanced Reservoir Description: Using Core and Log Data to Identify Hydraulic (Flow) Units and Predict Permeability in Uncored Intervals/Wells", SPE 68th Annual Technical Conference and Exhibition Proceedings, Society of Petroleum Engineers, Oct. 3-6, 1993, pp. 205-220.

Zhisjui Liu et al., "New evaluation methods using conventional logging data for gas shale in southern China", The Leading Edge, Nov. 2014, pp. 1244-1254, vol. 33, No. 11.

* cited by examiner

PREDICTING HYDRAULIC FRACTURE TREATMENT EFFECTIVENESS AND PRODUCTIVITY IN OIL AND GAS RESERVOIRS

CROSS REFERENCE TO RELATED APPLICATIONS

The present application is a National Stage of PCT Application No. PCT/IB2015/002249, filed Oct. 26, 2015, which claims priority and benefit from U.S. Provisional Patent Application No. 62/068,782, filed Oct. 27, 2014, for "Predict Hydraulic Fracture Treatment Effectiveness and Productivity in Oil and Gas Reservoirs", the entire contents of which is incorporated herein by reference.

TECHNICAL FIELD

Embodiments of the subject matter disclosed herein generally relate to methods and systems for hydrocarbon, gas and petroleum production from wells using fracturing techniques.

BACKGROUND

Hydraulic fracturing, which is also known as fracking, involves the high-pressure injection fluid into a well passing through a given subsurface in which oil, gas and petroleum reservoirs are located in order to create cracks in the rock formations through which fluids including the oil, natural gas and petroleum can flow more freely. In general, the target reservoirs are typically porous sandstones, limestones or dolomite rocks. However these reservoirs also include what is termed unconventional reservoirs that include shale rock or coal beds. Also included in the subsurface are clays and kerogen filled pores in unconventional reservoirs. The effectiveness of hydraulic fracturing in a given subsurface depends on the mineralogy of that subsurface. The hydraulic fracturing effectiveness is crucial in making a determination regarding whether to conduct hydraulic fracturing in a given project area or to lease a given project area for future production.

The mineralogy of the subsurface is determined using continuous well log data including sonic log data and discrete core analysis obtained for a given well passing through the subsurface and reservoir of the project area. A typically project area is large, for example, covering the area of multiple counties in a single state, and the number of wells in the project area is in the hundreds or thousands. However, well log data and core analysis only exists for a small number of wells in the project area. The vast majority of wells only have a basic suite of well log data and lack associated core analysis or elastic properties, i.e., sonic, data.

It is desirable to include wells that have just the basic suite of well logs in the prediction of productivity using robust physical methods. Previous attempts to include these wells have pursued empirically based correlation methods to leverage the sophisticated measurements in only the few of the project wells into the analysis of the balance of the project wells in the project area. These prior methods did not produce results with a high enough degree or coverage or confidence in the predicted results. Also, these prior methods could only cover existing wells and could not be used to predict the effectiveness of hydraulic fracturing in future wells in the project area.

The need still exists, however, for a more accurate determination of hydrocarbon productivity for a project area in a short period of time using all available wells which have a basic suite of well logs, not just the relatively handful of wells that have sophisticated measurements.

SUMMARY

Exemplary embodiments are directed to systems and methods that use physical models of the subsurface in the project area that are calibrated to data from laboratory analysis of rock samples and shear sonic measurements to integrate the processes of petrophysical analysis and mechanical rock properties analysis and provide the data necessary to predict the amount of recoverable hydrocarbons located within intervals that will respond to hydraulic fracture treatments in other wells in the project area that do not have data from the laboratory analysis of rock samples, i.e., well core analysis, or sonic measurements. Using these calibrated physical models enables the petrophysical reservoir properties and the elastic mechanical rock properties necessary to predict productivity in conventional and unconventional reservoirs to be determined. Exemplary systems and methods are based on robust physical models that are calibrated to the sophisticated measurements such that these physical models can be applied to both the existing and future wells in the project area with more coverage in the project area and with higher confidence in the predictions.

One exemplary embodiment is directed to a method for predicting hydraulic fracture treatment. In this method, a petrophysical properties model is created for a given subsurface region using well log data and core data from at least one first well extending through the given subsurface. The petrophysical properties model yields fluid volumes and mineral volumes in any given well passing through the subsurface region using only well log data. Alternatively, the petrophysical properties model yields fluid volumes and mineral volumes in any given well passing through the subsurface region using well log data in combination with other types of data. Suitable well log data include but are not limited to, neutron porosity, gamma ray measurement, resistivity and litho-density. Suitable core data include, but are not limited to, mineralogy, porosity and permeability from x-ray diffraction core analysis.

In one embodiment, the well log data and core data from the least one first well, a stochastic mineral and fluid identification routine are used to create the petrophysical properties model. Using the well log data and core data from the least one first well, a stochastic mineral and fluid identification routine includes using a system of linear simultaneous equations having variants around each well log datum and using the core data to set well log datum values for known minerals and unknown minerals. In one embodiment, the unknown minerals are clay, kerogen or combinations thereof.

An elastic rock properties model is created for the given subsurface using fluid volumes, mineral volumes and dipole sonic data from at least one second well extending through the given subsurface. The elastic rock properties model yields elastic properties in any given well passing through the subsurface region using only well log data, mineral volumes and fluid volumes. Alternatively, the elastic rock properties model yields elastic properties in any given well passing through the subsurface region using well log data, mineral volumes and fluid volumes in combination with other types of data. In one embodiment, the at least one first well and the at least one second well are a single well. In one embodiment, the dipole sonic data include compressional sonic data and shear sonic data. In one embodiment, the elastic properties in any given well are Poisson's Ratio or Young's Modulus.

In one embodiment, only well log data from at least one additional well extending through the given subsurface are used in at least one of the petrophysical properties model and the elastic rock properties model to predict an amount of recoverable hydrocarbons located within intervals of the at least one additional well that will respond to hydraulic fracture treatments. In one embodiment, using only well log data to predict an amount of recoverable hydrocarbons that will respond to hydraulic fracture treatments includes using only well log data from a plurality of additional wells extending through the given subsurface in at least one of the petrophysical properties model and the elastic rock properties model to predict an amount of recoverable hydrocarbons located within intervals of each additional well that will respond to hydraulic fracture treatments. In one embodiment, the plurality of additional wells includes at least 100 additional wells. Alternatively, the plurality of additional wells includes at least 1000 additional wells. In one embodiment, well log data from at least one additional well extending through the given subsurface in combination with additional data are used in at least one of the petrophysical properties model and the elastic rock properties model to predict an amount of recoverable hydrocarbons located within intervals of the at least one additional well that will respond to hydraulic fracture treatments.

In one embodiment, using only well log data to predict an amount of recoverable hydrocarbons that will respond to hydraulic fracture treatments also includes generating a map of hydrocarbons in place in the subsurface region. In one embodiment, using only well log data to predict an amount of recoverable hydrocarbons that will respond to hydraulic fracture treatments also includes at least one of identifying intervals within the at least one additional well that will respond to a hydraulic fracture treatment, computing a volume of in place within intervals within the at least one additional well that will respond to hydraulic fracture treatment, determining hydraulic fracture treatment for given intervals within the at least one additional well and estimating an estimated recovery of hydrocarbons for given intervals.

In one embodiment, an empirical relationship is defined between fluid volumes and minerals volumes determined by the petrophysical properties model and at least one of permeability in the subsurface region and porosity in the subsurface region. The fluid volumes and mineral volumes determined for the at least one additional well using only well log data from at least one additional well are used in the petrophysical properties model to determine at least one of permeability and porosity in the subsurface region.

Exemplary embodiments are also directed to a computer-readable medium containing computer-executable code that when read by a computer causes the computer to perform a method for predicting hydraulic fracture treatment. In this method a petrophysical properties model is created for a given subsurface region using well log data and core data from at least one first well extending through the given subsurface. The petrophysical properties model yields fluid volumes and mineral volumes in any given well passing through the subsurface region using only well log data.

An elastic rock properties model is created for the given subsurface using fluid volumes, mineral volumes and dipole sonic data from at least one second well extending through the given subsurface. The elastic rock properties model yields elastic properties in any given well passing through the subsurface region using only well log data, mineral volumes and fluid volumes. Only well log data from at least one additional well extending through the given subsurface in at least one of the petrophysical properties model and the elastic rock properties model are used to predict an amount of recoverable hydrocarbons located within intervals of the at least one additional well that will respond to hydraulic fracture treatments.

In one embodiment, an empirical relationship is defined between fluid volumes and minerals volumes determined by the petrophysical properties model and at least one of permeability in the subsurface region and porosity in the subsurface region. In addition, using only well log data to predict an amount of recoverable hydrocarbons that will respond to hydraulic fracture treatments includes at least one of identifying intervals within the at least one additional well that will respond to a hydraulic fracture treatment, computing a volume of in place within intervals within the at least one additional well that will respond to hydraulic fracture treatment, determining hydraulic fracture treatment for given intervals within the at least one additional well and estimating an estimated recovery of hydrocarbons for given intervals.

Exemplary embodiments are also directed to a computing system for predicting hydraulic fracture treatment. The computing system includes a storage device containing well log data, core data and dipole sonic data for a plurality of wells passing through a subsurface region and a processer in communication with the storage device. The processor is configured to create a petrophysical properties model for the given subsurface region using well log data and core data from at least one first well extending through the given subsurface. The petrophysical properties model yield fluid volumes and mineral volumes in any given well passing through the subsurface region using only well log data. The processor is also configured to create an elastic rock properties model for the given subsurface using fluid volumes, mineral volumes and dipole sonic data from at least one second well extending through the given subsurface. The elastic rock properties model yields elastic properties in any given well passing through the subsurface region using only well log data, mineral volumes and fluid volumes.

The processor is configured to use only well log data from at least one additional well extending through the given subsurface in at least one of the petrophysical properties model and the elastic rock properties model to predict an amount of recoverable hydrocarbons located within intervals of the at least one additional well that will respond to hydraulic fracture treatments.

BRIEF DESCRIPTION OF THE DRAWINGS

The accompanying drawings, which are incorporated in and constitute a part of the specification, illustrate one or more embodiments and, together with the description, explain these embodiments. In the drawings.

DETAILED DESCRIPTION

Figure 1:
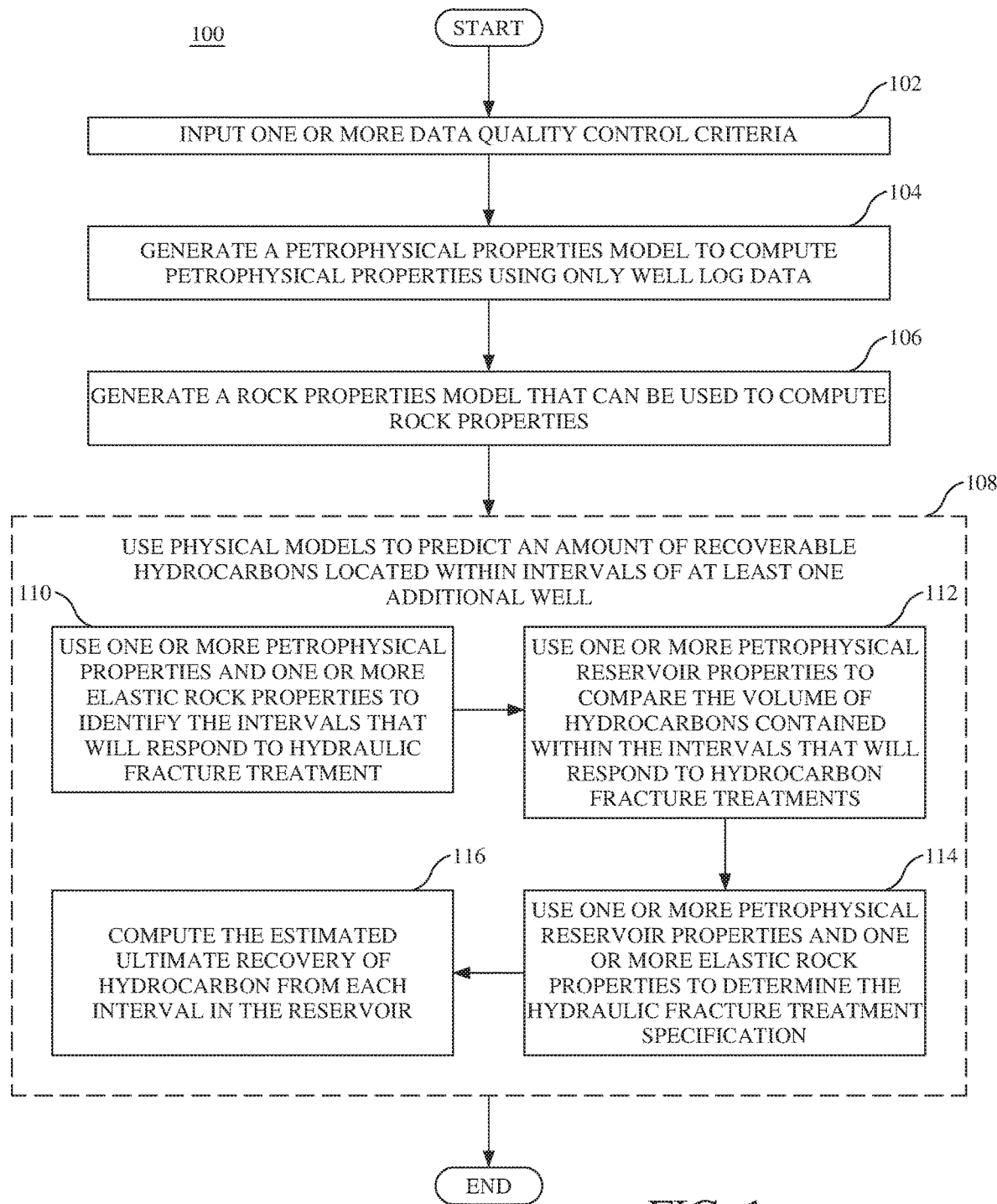
FIG. 1 is a flowchart of an embodiment of a method for predicting hydraulic fracture treatment.

The following description of the embodiments refers to the accompanying drawings. The same reference numbers in different drawings identify the same or similar elements. The following detailed description does not limit the invention. Instead, the scope of the invention is defined by the appended claims. Some of the following embodiments are discussed, for simplicity, with regard to local activity taking place within the area of a seismic survey. However, the embodiments to be discussed next are not limited to this configuration, but may be extended to other arrangements that include regional activity, conventional seismic surveys, etc.

Reference throughout the specification to "one embodiment" or "an embodiment" means that a particular feature, structure or characteristic described in connection with an embodiment is included in at least one embodiment of the subject matter disclosed. Thus, the appearance of the phrases "in one embodiment" or "in an embodiment" in various places throughout the specification is not necessarily referring to the same embodiment. Further, the particular features, structures or characteristics may be combined in any suitable manner in one or more embodiments.

Exemplary embodiments of systems and methods predict the effectiveness of hydraulic fracturing and the ultimate recovery of hydrocarbons from reservoirs in a given project area. As used herein, the project area refers to a physical area that can cover, for example, one or more counties in a state. The subsurface below the project area contains at least one and possibly a plurality of oil, natural gas or petroleum reservoirs, both conventional reservoirs and unconventional reservoirs. These reservoirs can be located at different intervals, i.e., spanning through different depths, in the subsurface. For a given project area, there is a consistency in core data obtained from wells passing through the subsurface.

The project area includes a plurality of wells drilled through the subsurface. In one embodiment, the project area includes at least one hundred wells or possibly multiple hundreds of wells. Alternatively, the project area includes at least one thousand wells or possibly multiple thousands of wells. A basic suite of well log data, for example, well log data continuously obtained from a wireline, is available for all of the wells in the project area. This basic suite of well log data includes neutron porosity, gamma ray measurement, resistivity and litho-density (photo-electric factor (PEF) and density). At least one first well includes both this well log data and core data. Core data represent discrete measurements obtained, for example, from laboratory measurements of well cores, including full-bore cores and rotary side-wall cores, obtained from the well. The core data include x-ray diffraction (XRD) mineralogy, porosity and permeability. At least one second well includes the well log data and elastic data or dipole sonic data (p-wave sonic data and s-wave sonic data). There can be multiple first wells in the project area and multiple second wells in the project area. However, the first and second wells represent a small percentage of all wells in the project area. In one embodiment, the first wells and the second wells are the same wells, i.e., these wells include the well log data, core data and elastic data.

Referring initially to FIG. 1, an embodiment for predicting hydraulic fracture treatment effectiveness and reservoir productivity in the project area 100 is illustrated as a multi-step process. As the overall process is underdetermined, i.e., more mineral outputs exist than the number of continuous well log inputs, the process can result in multiple solutions. However, only one solution is the correct solution. Therefore, one or more data quality control criteria are identified 102. Each of the well log measurements is corrected, as required, for miss-calibration or environmental effects. This is accomplished by matching the input well logs to the reconstructed well logs, i.e., well logs reconstructed using the generated models. In addition to matching actual and reconstructed logs. The input core derived mineral volume data generated by x-ray diffraction analysis of core samples, is matched to mineral volume data predicted by the generated models. If both the reconstructed and actual well log data and the predicted and input core mineral volume data match, then the model solutions generated are the correct solutions.

Next, a petrophysical properties model is generated 104. In one embodiment, the petrophysical properties model computes petrophysical properties using only well log data. Alternatively, the petrophysical properties model computes petrophysical properties using well log data in combination with additional subsurface data including core data and seismic data or data covering any property of the subsurface, for example, as described herein. The petrophysical properties include, mineral volumes, fluid volumes, porosity and permeability in a given well, and the well log data represents a basic suite of measurements that includes Gamma Ray, Litho-Density, Neutron and Resistivity logs. In one embodiment, a statistical system of simultaneous linear equations with appropriate physical property values for each type of well log for each mineral or fluid is used to generate the petrophysical properties model. These simultaneous linear equations use as input the quality control criteria input data in the first step in addition to well log data and core data for at least one well in the project area. Proper selection of the combination of minerals and the appropriate physical property values is perfected by constraining the results to other fluid volume, mineral volume, porosity and permeability data from other sources in the at least one of well selected from the plurality of wells in the project area. These other data include laboratory analysis of rock samples, x-ray diffraction measurements and elemental spectrographic well log data.

In the next step, a rock properties model is generated 106. This rock properties model computes elastic rock properties using the fluid volumes and mineral volumes obtained from the petrophysical properties model. The elastic rocks properties include Poisson's Ratio, Young's Modulus. The rock properties model is constrained by measured elastic properties computed from the compressional interval transit time, shear interval transit time and density in at least one second well selected form the plurality of wells in the project area. Therefore, two physical models of the subsurface in the project area have been generated, and these physical models are then used to predict an amount of recoverable hydrocarbons located within intervals of the at least one additional well that will respond to hydraulic fracture treatments 108.

Using the physical models to predict hydrocarbon production and hydraulic fracturing effectiveness includes, using one or more of the petrophysical reservoir properties derived from the petrophysical properties model and one or more elastic rock properties derived from the rock properties model to identify the intervals in the subsurface or well that will respond to a hydraulic fracture treatment 110. Rock of sufficient brittleness will respond to a hydraulic fracture treatment and retain fluid flow conductivity within the fracture to sustain the flow of the formation fluids to the well bore. Combining the formation permeability calculations with the computation of elastic mechanical rock properties enables the identification of the layers that will respond to the hydraulic treatment and sustain fluid flow to the well bore from the reservoir.

In addition, one or more petrophysical reservoir properties are used to compute the volume of hydrocarbons in place contained within the intervals that will respond to hydraulic fracture treatments 112. After the intervals that will respond to hydraulic fracturing treatments are identified, the petrophysical reservoir properties are used to compute the volume of hydrocarbons in place for the productive intervals determined in the previous step.

Next, one or more petrophysical reservoir properties and one or more elastic rock properties are used to determine the hydraulic fracture treatment specifications 114. These specifications are used for treatment of each interval to be treated using the hydraulic fracture method. Data from the analysis are used to created individual hydraulic fracture treatments for each reservoir interval that has been identified as productive. The treatment specification uses physical design models that utilize petrophysical and elastic mechanical rock properties as input data.

Results from the hydraulic fracture treatment specification and resulting physical design models are used to compute the estimated ultimate recovery of hydrocarbons from each interval in the reservoir 116. The treatment design modeling method provides computed results of fluid productivity after the hydraulic stimulation treatments.

Figure 2:
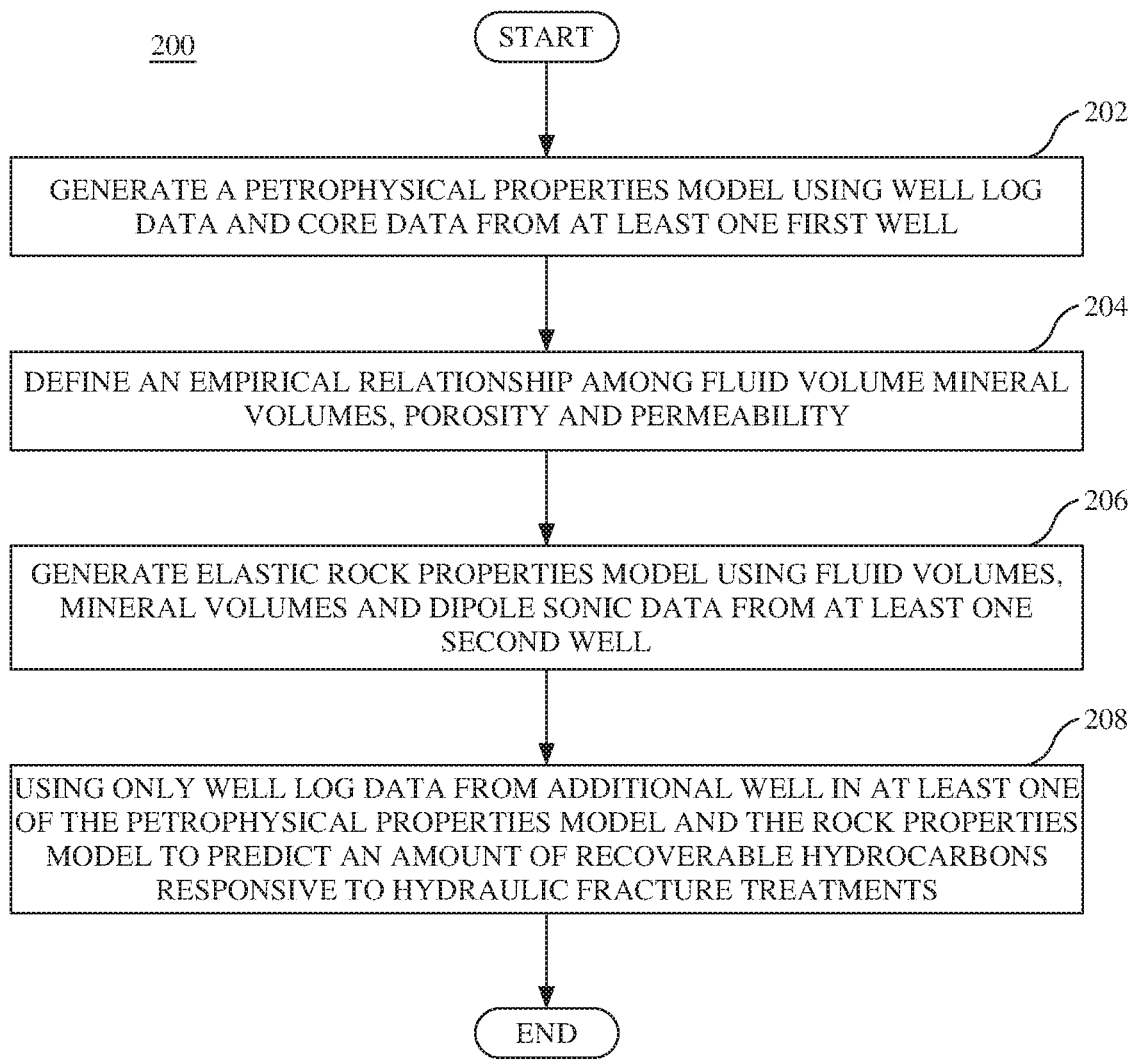
FIG. 2 is a flowchart of another embodiment of a method for predicting hydraulic fracture treatment.

Referring now to FIG. 2, an exemplary method for predicting hydraulic fracture treatment 200 is illustrated. In this method a petrophysical properties model is generated for a given subsurface region using well log data and core data from at least one first well extending through the given subsurface 202. Alternatively, well log data and core data from a plurality of first wells can be used. Suitable well log data includes neutron porosity, gamma ray measurement, resistivity and litho-density. Suitable core data, obtained for example, in the laboratory or from in-field testing using cores extracted from the at least one first well include x-ray diffraction mineralogy, porosity and permeability. The result is a physical model of the subsurface, and the petrophysical properties model yields fluid volumes and mineral volumes in any given well passing through the subsurface region using only well log data. Therefore, wells in the project area for which only the well log data are available can be used to determine the mineral and fluid volumes in the subsurface through which the well passes.

Any suitable method for generating a petrophysical properties model can be used. In one embodiment, the well log data and core data from the least one first well are used a stochastic mineral and fluid identification routine to create the petrophysical properties model. This stochastic mineral and fluid identification routine uses a system of linear simultaneous equations having variants around each end point, well log property or well log datum for each mineral type in the subsurface. The end points or well log properties are constrained using the well core data since there are more mineral outputs than mineral inputs. For example, the end points are set to match values coming from the well core data for example for known minerals. In addition, values are established for lesser known or unknown minerals in the subsurface such as clay and kerogen. Having set the properties, the constraints can be turned off, and the basic well log data from the first well is used to generate the model. Therefore, the resulting petrophysical properties model can be propagated to or used with other wells that only have the basic well log data in order the generate the mineral and fluid volumes.

In order to also derive the permeability values, an empirical relationship is defined between fluid volumes and minerals volumes determined by the petrophysical properties model and at least one of permeability in the subsurface region and porosity in the subsurface region 204. Therefore, the fluid volumes and mineral volumes determined in the petrophysical properties model for the at least one additional well using only well log data from that additional well are used to determine at least one of permeability in the subsurface region.

Next, an elastic rock properties model is generated for the given subsurface in the project are using fluid volumes, mineral volumes and dipole sonic data from at least one second well extending through the given subsurface 206. The elastic rock properties model yields elastic properties in any given well passing through the subsurface region using only well log data, mineral volumes and fluid volumes. Alternatively, the elastic rock properties model yields elastic properties in any given well passing through the subsurface region using well log data, mineral volumes and fluid volumes in combination with additional subsurface data including core data and seismic data or data covering any property of the subsurface, for example, as described herein. In one embodiment, fluid volumes, mineral volumes and dipole sonic data from a plurality a second wells. In one embodiment, the at least one first well and the at least one second well are the same well, i.e., a single well having the well log data, core data and sonic elasticity data. The dipole sonic data include compressional sonic data and shear sonic data as obtained from a dipole sonic logging tool in at least one well. Suitable elastic properties in any given well include Poisson's Ratio or Young's Modulus. The result is a physical model of the elastic rock properties of the subsurface that can be used to determine the elastic rock properties for any well in the project are for which only well log data are available.

Only well log data from at least one additional well extending through the given subsurface can be used in at least one of the petrophysical properties model and the elastic rock properties model to predict an amount of recoverable hydrocarbons located within intervals of the at least one additional well that will respond to hydraulic fracture treatments 208. Alternatively, well log data from a plurality of additional wells is used to predict the amount of recoverable hydrocarbons using the petrophysical properties model and elastic rock properties model. All of the additional wells only have well log data and not core data or dipole sonic data. In one embodiment, the plurality of additional wells contains at least 100 additional wells or at least 1000 additional wells. In one embodiment, well log data from at least one additional well extending through the given subsurface in combination with additional subsurface data including core data and seismic data or data covering any property of the subsurface, for example, as described herein can be used in at least one of the petrophysical properties model and the elastic rock properties model to predict an amount of recoverable hydrocarbons located within intervals of the at least one additional well that will respond to hydraulic fracture treatments In one embodiment, predicting the amount of recoverable hydrocarbons that will respond to hydraulic fracture treatments includes generating a map of hydrocarbons in place in the subsurface region. In one embodiment, using only well log data to predict an amount of recoverable hydrocarbons that will respond to hydraulic fracture treatments includes predicting an amount of recoverable hydrocarbons located within intervals of each additional well that will respond to hydraulic fracture treatments. In one embodiment, predicting the amount of recoverable hydrocarbons that will respond to hydraulic fracture treatments further includes at least one of identifying intervals within the at least one additional well that will respond to a hydraulic fracture treatment, computing a volume of in place within intervals within the at least one additional well that will respond to hydraulic fracture treatment, determining hydraulic fracture treatment for given intervals within the at least one additional well and estimating an estimated recovery of hydrocarbons for given intervals.

Therefore, the well log data, core data and elastic rock properties data from a small number of wells in project area having a consistent subsurface structure and one or more reservoirs are leveraged to generate physical models of the subsurface that can be extending to all of the other wells in the project are for which only well log data are available. These well log data can then be used to determine the petrophysical properties and rock properties at those other wells, and these properties are used to predict the location hydrocarbon reservoirs (oil, natural gas and petroleum) that will respond favorably to hydraulic fracturing treatments. The location includes the location of the wells in the project area and the range of depths, i.e., the intervals in those wells. In addition, the yield from these wells can also be predicted. These predictions are used to determine whether or not to acquire rights in the project area or to conduct hydraulic fracturing.

Figure 3:
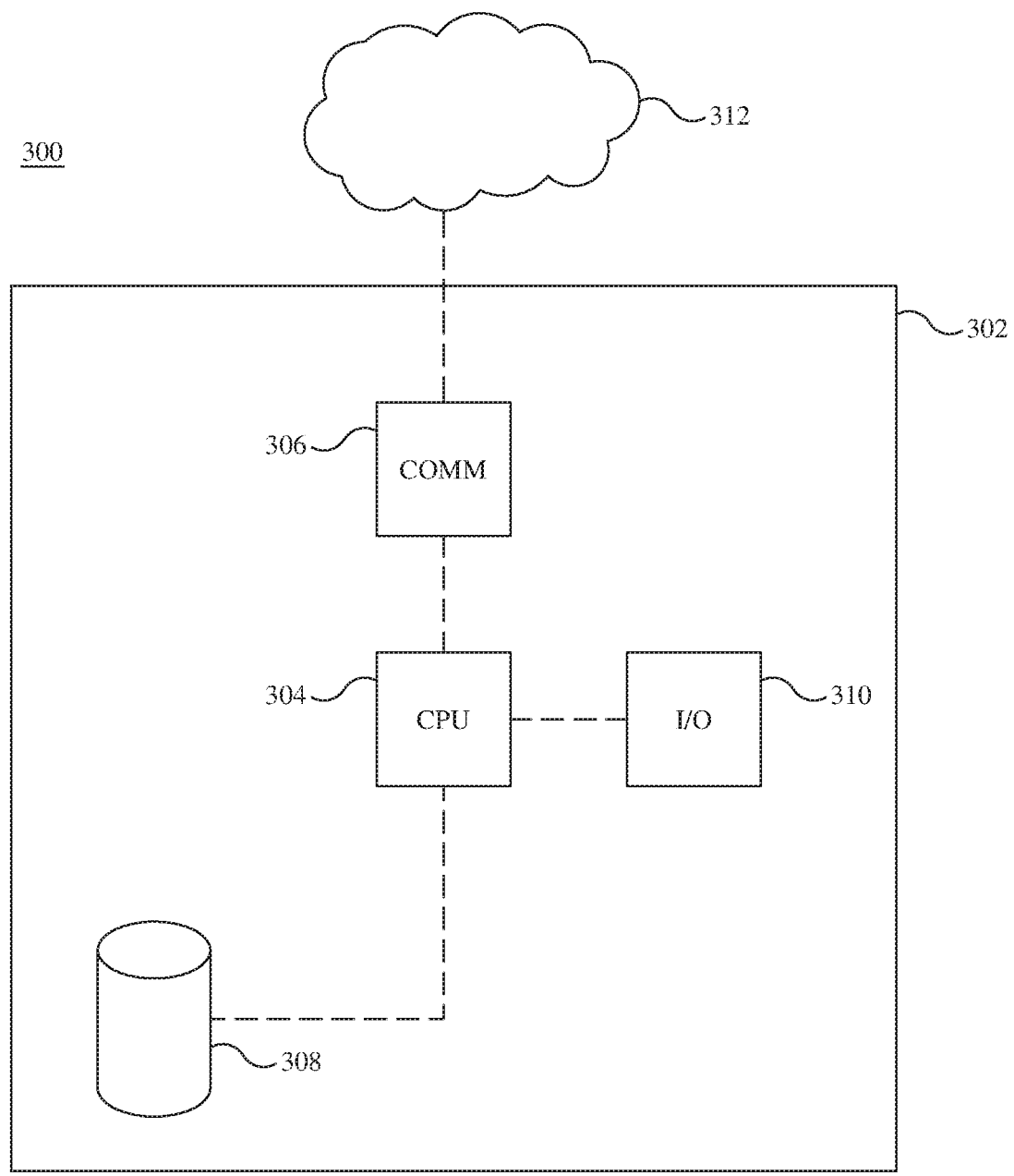
FIG. 3 is a schematic representation of an embodiment of a computing system for use in executing a method for predicting hydraulic fracture treatment.

Referring now to FIG. 3, exemplary embodiments are directed to a computing system 300 for predicting hydraulic fracture treatment. In one embodiment, a computing device for performing the calculations as set forth in the above-described embodiments may be any type of computing device capable of obtaining, processing and communicating multi-vintage seismic data associated with seismic surveys conducted at different time periods. The computing system 300 includes a computer or server 302 having one or more central processing units 304 in communication with a communication module 306, one or more input/output devices 310 and at least one storage device 308.

The communication module is used to obtain well log data, core data and dipole sonic data for a plurality of wells passing through a subsurface region in a project area. These well log data, core data and dipole sonic data can be obtained, for example, through the input/output devices. The well log data, core data and dipole sonic data are stored in the storage device. In addition, the storage device is used to store the petrophysical properties model, rock properties model and derived empirical relationships among fluid volumes, mineral volumes, porosity and permeability. The input/output device can also be used to communicate or display the predictions for the efficacy and yield of hydraulic fracturing, for example, to a user of the computing system.

The processer is in communication with the communication module and storage device and is configured to create a petrophysical properties model for the given subsurface region using well log data and core data from at least one first well extending through the given subsurface. The petrophysical properties model yields fluid volumes and mineral volumes in any given well passing through the subsurface region using only well log data. The processor is further configured to create an elastic rock properties model for the given subsurface using fluid volumes, mineral volumes and dipole sonic data from at least one second well extending through the given subsurface. The elastic rock properties model yields elastic properties in any given well passing through the subsurface region using only well log data, mineral volumes and fluid volumes. The processor is also configured to use only well log data from at least one additional well extending through the given subsurface in at least one of the petrophysical properties model and the elastic rock properties model to predict an amount of recoverable hydrocarbons located within intervals of the at least one additional well that will respond to hydraulic fracture treatments. These predictions can be stored in the database, displayed in the input/output devices or communicated with the communication module.

Suitable embodiments for the various components of the computing system are known to those of ordinary skill in the art, and this description includes all known and future variants of these types of devices. The communication module provides for communication with other computing systems, databases and data acquisition systems across one or more local or wide area networks 312. This includes both wired and wireless communication. Suitable input/output devices include keyboards, point and click type devices, audio devices, optical media devices and visual displays.

Suitable storage devices include magnetic media such as a hard disk drive (HDD), solid state memory devices including flash drives, ROM and RAM and optical media. The storage device can contain data as well as software code for executing the functions of the computing system and the functions in accordance with the methods described herein. Therefore, the computing system 300 can be used to implement the methods described above associated with predicting hydraulic fracture treatment. Hardware, firmware, software or a combination thereof may be used to perform the various steps and operations described herein.

Methods and systems in accordance with exemplary embodiments can be hardware embodiments, software embodiments or a combination of hardware and software embodiments. In one embodiment, the methods described herein are implemented as software. Suitable software embodiments include, but are not limited to, firmware, resident software and microcode. In addition, exemplary methods and systems can take the form of a computer program product accessible from a computer-usable or computer-readable medium providing program code for use by or in connection with a computer, logical processing unit or any instruction execution system. In one embodiment, a machine-readable or computer-readable medium contains a machine-executable or computer-executable code that when read by a machine or computer causes the machine or computer to perform a method for predicting hydraulic fracture treatment in accordance with exemplary embodiments and to the computer-executable code itself. The machine-readable or computer-readable code can be any type of code or language capable of being read and executed by the machine or computer and can be expressed in any suitable language or syntax known and available in the art including machine languages, assembler languages, higher level languages, object oriented languages and scripting languages.

As used herein, a computer-usable or computer-readable medium can be any apparatus that can contain, store, communicate, propagate, or transport the program for use by or in connection with the instruction execution system, apparatus, or device. Suitable computer-usable or computer readable mediums include, but are not limited to, electronic, magnetic, optical, electromagnetic, infrared, or semiconductor systems (or apparatuses or devices) or propagation mediums and include non-transitory computer-readable mediums. Suitable computer-readable mediums include, but are not limited to, a semiconductor or solid state memory, magnetic tape, a removable computer diskette, a random access memory (RAM), a read-only memory (ROM), a rigid magnetic disk and an optical disk. Suitable optical disks include, but are not limited to, a compact disk-read only memory (CD-ROM), a compact disk-read/write (CD-R/W) and DVD.

The disclosed exemplary embodiments provide a computing device, software and method for method for inversion of multi-vintage seismic data. It should be understood that this description is not intended to limit the invention. On the contrary, the exemplary embodiments are intended to cover alternatives, modifications and equivalents, which are included in the spirit and scope of the invention. Further, in the detailed description of the exemplary embodiments, numerous specific details are set forth in order to provide a comprehensive understanding of the invention. However, one skilled in the art would understand that various embodiments may be practiced without such specific details.

Although the features and elements of the present exemplary embodiments are described in the embodiments in particular combinations, each feature or element can be used alone without the other features and elements of the embodiments or in various combinations with or without other features and elements disclosed herein. The methods or flowcharts provided in the present application may be implemented in a computer program, software, or firmware tangibly embodied in a computer-readable storage medium for execution by a geophysics dedicated computer or a processor.

This written description uses examples of the subject matter disclosed to enable any person skilled in the art to practice the same, including making and using any devices or systems and performing any incorporated methods. The patentable scope of the subject matter is defined by the claims, and may include other examples that occur to those skilled in the art. Such other examples are intended to be within the scope of the claims.

What is claimed is:

1. A method for predicting hydraulic fracture treatment, the method comprising:
    creating a petrophysical properties model for a given subsurface region using well log data and core data from at least one first well extending through the given subsurface, the petrophysical properties model yielding fluid volumes and mineral volumes in any given well passing through the subsurface region using only well log data;
    creating an elastic rock properties model for the given subsurface using fluid volumes, mineral volumes and dipole sonic data from at least one second well extending through the given subsurface, the elastic rock properties model yielding elastic properties in any given well passing through the subsurface region using only well log data, mineral volumes and fluid volumes; and
    using only well log data from at least one additional well extending through the given subsurface in at least one of the petrophysical properties model and the elastic rock properties model to predict an amount of recoverable hydrocarbons located within intervals of the at least one additional well that will respond to hydraulic fracture treatments.

2. The method of claim 1, wherein the well log data comprise neutron porosity, gamma ray measurement, resistivity and litho-density.

3. The method of claim 1, wherein the core data comprise mineralogy, porosity and permeability from x-ray diffraction core analysis.

4. The method of claim 1, wherein the at least one first well and the at least one second well comprise a single well.

5. The method of claim 1, wherein creating the petrophysical properties model for the given subsurface region comprises using the well log data and core data from the least one first well, a stochastic mineral and fluid identification routine to create the petrophysical properties model.

6. The method of claim 5, wherein using the well log data and core data from the least one first well a stochastic mineral and fluid identification routine comprises using a system of linear simultaneous equations comprising variants around each well log datum and using the core data to set well log datum values for known minerals and unknown minerals.

7. The method of claim 6, wherein the unknown minerals comprise clay, kerogen or combinations thereof.

8. The method of claim 1, further comprising defining an empirical relationship between fluid volumes and minerals volumes determined by the petrophysical properties model and at least one of permeability in the subsurface region and porosity in the subsurface region.

9. The method of claim 8, further comprising using the fluid volumes and mineral volumes determined for the at least one additional well using only well log data from at least one additional well in the petrophysical properties model to determine at least one of permeability and porosity in the subsurface region.

10. The method of claim 1, wherein the dipole sonic data comprise compressional sonic data and shear sonic data.

11. The method of claim 1, wherein the elastic properties in any given well comprise Poisson's Ratio or Young's Modulus.

12. The method of claim 1, wherein using only well log data to predict an amount of recoverable hydrocarbons that will respond to hydraulic fracture treatments further comprises using only well log data from a plurality of additional wells extending through the given subsurface in at least one of the petrophysical properties model and the elastic rock properties model to predict an amount of recoverable hydrocarbons located within intervals of each additional well that will respond to hydraulic fracture treatments.

13. The method of claim 1, wherein using only well log data to predict the amount of recoverable hydrocarbons that will respond to hydraulic fracture treatments further comprises generating a map of hydrocarbons in place in the subsurface region.

14. The method of claim 1, wherein using only well log data to predict the amount of recoverable hydrocarbons that will respond to hydraulic fracture treatments further comprises at least one of identifying intervals within the at least one additional well that will respond to a hydraulic fracture treatment, computing a volume of in place within intervals within the at least one additional well that will respond to hydraulic fracture treatment, determining hydraulic fracture treatment for given intervals within the at least one additional well and estimating an estimated recovery of hydrocarbons for given intervals.

15. A non-transitory computer-readable medium containing computer-executable code that when read by a computer causes the computer to perform a method for predicting hydraulic fracture treatment, the method comprising:
    creating a petrophysical properties model for a given subsurface region using well log data and core data from at least one first well extending through the given subsurface, the petrophysical properties model yielding fluid volumes and mineral volumes in any given well passing through the subsurface region using only well log data;

creating an elastic rock properties model for the given subsurface using fluid volumes, mineral volumes and dipole sonic data from at least one second well extending through the given subsurface, the elastic rock properties model yielding elastic properties in any given well passing through the subsurface region using only well log data, mineral volumes and fluid volumes; and using only well log data from at least one additional well extending through the given subsurface in at least one of the petrophysical properties model and the elastic rock properties model to predict an amount of recoverable hydrocarbons located within intervals of the at least one additional well that will respond to hydraulic fracture treatments.

16. The non-transitory computer-readable medium of claim 15, wherein the method further comprises defining an empirical relationship between fluid volumes and minerals volumes determined by the petrophysical properties model and at least one of permeability in the subsurface region and porosity in the subsurface region.

17. The non-transitory computer-readable medium of claim 15, wherein using only well log data to predict an amount of recoverable hydrocarbons that will respond to hydraulic fracture treatments further comprises at least one of identifying intervals within the at least one additional well that will respond to a hydraulic fracture treatment, computing a volume of in place within intervals within the at least one additional well that will respond to hydraulic fracture treatment, determining hydraulic fracture treatment for given intervals within the at least one additional well and estimating an estimated recovery of hydrocarbons for given intervals.

18. A computing system for predicting hydraulic fracture treatment, the computing system comprising:
a storage device comprising well log data, core data and dipole sonic data for a plurality of wells passing through a subsurface region; and
a processor in communication with the storage device and configured to:
create a petrophysical properties model for the given subsurface region using well log data and core data from at least one first well extending through the given subsurface, the petrophysical properties model yielding fluid volumes and mineral volumes in any given well passing through the subsurface region using only well log data;
create an elastic rock properties model for the given subsurface using fluid volumes, mineral volumes and dipole sonic data from at least one second well extending through the given subsurface, the elastic rock properties model yielding elastic properties in any given well passing through the subsurface region using only well log data, mineral volumes and fluid volumes; and
use only well log data from at least one additional well extending through the given subsurface in at least one of the petrophysical properties model and the elastic rock properties model to predict an amount of recoverable hydrocarbons located within intervals of the at least one additional well that will respond to hydraulic fracture treatments.

19. The computing system of claim 18, wherein the processor is configure to predict the amount of recoverable hydrocarbons that will respond to hydraulic the fracture treatments by performing at least one of identifying intervals within the at least one additional well that will respond to a hydraulic fracture treatment, computing a volume of in place within intervals within the at least one additional well that will respond to hydraulic fracture treatment, determining hydraulic fracture treatment for given intervals within the at least one additional well and estimating an estimated recovery of hydrocarbons for given intervals.

* * * * *